United States Patent
Ranta et al.

(10) Patent No.: US 10,141,958 B2
(45) Date of Patent: Nov. 27, 2018

(54) ADAPTIVE TUNING NETWORK FOR COMBINABLE FILTERS

(71) Applicant: pSemi Corporation, San Diego, CA (US)

(72) Inventors: Tero Tapio Ranta, San Diego, CA (US); Kevin Roberts, Rohnert Park, CA (US); Chih-Chieh Cheng, Poway, CA (US)

(73) Assignee: pSemi Corporation, San Diego, CA (US)

( * ) Notice: Subject to any disclaimer, the term of this patent is extended or adjusted under 35 U.S.C. 154(b) by 16 days.

(21) Appl. No.: 15/048,764

(22) Filed: Feb. 19, 2016

(65) Prior Publication Data

US 2017/0244432 A1    Aug. 24, 2017

(51) Int. Cl.
  *H04B 1/04*    (2006.01)
  *H04B 1/40*    (2015.01)
  (Continued)

(52) U.S. Cl.
  CPC ............ *H04B 1/0067* (2013.01); *H03H 7/40* (2013.01); *H04B 1/0053* (2013.01);
  (Continued)

(58) Field of Classification Search
  CPC ........ H04B 1/0057; H04B 1/006; H04B 1/56; H04B 1/00; H03H 7/0115; H03H 7/0153;
  (Continued)

(56) References Cited

U.S. PATENT DOCUMENTS

| | | | |
|---|---|---|---|
| 6,249,687 B1 * | 6/2001 | Thomsen | H01P 1/213 375/316 |
| 7,339,445 B2 * | 3/2008 | Aigner | H03H 9/706 333/133 |

(Continued)

FOREIGN PATENT DOCUMENTS

WO    2017142625    8/2017

OTHER PUBLICATIONS

Patrice, Nathalie, Invitation to Pay Additional Fees received from the EPO dated Apr. 10, 2017 for appln. No. US/PCT2016/069030, 7 pgs.

(Continued)

*Primary Examiner* — Pablo Tran
(74) *Attorney, Agent, or Firm* — Jaquez Land Greenhaus LLP; Martin J. Jaquez, Esq.; John Land, Esq.

(57) ABSTRACT

A flexible multi-path RF adaptive tuning network switch architecture that counteracts impedance mismatch conditions arising from various combinations of coupled RF band filters, particularly in a Carrier Aggregation-based radio system. In one version, a digitally-controlled tunable matching network is coupled to a multi-path RF switch in order to provide adaptive impedance matching for various combinations of RF band filters. Optionally, some or all RF band filters also include an associated digitally-controlled filter pre-match network to further improve impedance matching. In a second version, some or all RF band filters coupled to a multi-path RF switch include a digitally-controlled phase matching network to provide necessary per-band impedance matching. Optionally, a digitally-controlled tunable matching network may also be included on the common port of the multi-path RF switch to provide additional impedance matching capability.

19 Claims, 10 Drawing Sheets

(51) Int. Cl.
*H01B 1/00* (2006.01)
*H04W 88/06* (2009.01)
*H03H 7/38* (2006.01)
*H04B 1/00* (2006.01)
*H03H 7/40* (2006.01)
*H04B 1/401* (2015.01)

(52) U.S. Cl.
CPC .......... *H04B 1/0458* (2013.01); *H04B 1/401* (2013.01); *H04W 88/06* (2013.01)

(58) Field of Classification Search
CPC .......... H03H 7/1758; H03H 7/01; H03H 7/38; H03F 1/56
See application file for complete search history.

(56) References Cited

U.S. PATENT DOCUMENTS

| | | | | |
|---|---|---|---|---|
| 7,729,724 | B2* | 6/2010 | Rofougaran | H04B 1/006 |
| | | | | 455/102 |
| 8,193,877 | B2* | 6/2012 | Fritz | H03H 9/706 |
| | | | | 333/133 |
| 9,024,700 | B2 | 5/2015 | Ranta | |
| 9,118,376 | B2 | 8/2015 | Khalt et al. | |
| 9,197,194 | B2 | 11/2015 | Reedy et al. | |
| 9,712,197 | B2 | 7/2017 | Ripley et al. | |
| 2012/0238224 | A1* | 9/2012 | Iwai | H04B 1/0458 |
| | | | | 455/91 |
| 2012/0274417 | A1* | 11/2012 | Kihara | H03H 7/38 |
| | | | | 333/133 |
| 2012/0300679 | A1* | 11/2012 | Tsutsumi | H04B 1/18 |
| | | | | 370/278 |
| 2013/0063223 | A1 | 3/2013 | See et al. | |
| 2013/0122831 | A1* | 5/2013 | Desclos | H04B 1/525 |
| | | | | 455/78 |
| 2013/0241666 | A1* | 9/2013 | Granger-Jones | H01P 1/15 |
| | | | | 333/101 |
| 2013/0250819 | A1 | 9/2013 | Khlat et al. | |
| 2013/0273860 | A1* | 10/2013 | Pehlke | H04B 1/44 |
| | | | | 455/78 |
| 2014/0073268 | A1* | 3/2014 | Taniuchi | H01P 1/10 |
| | | | | 455/83 |
| 2014/0112213 | A1 | 4/2014 | Norholm et al. | |
| 2015/0055428 | A1 | 2/2015 | Henry et al. | |
| 2015/0295596 | A1 | 10/2015 | Wloczysiak et al. | |
| 2017/0346516 | A1 | 11/2017 | Ripley et al. | |

OTHER PUBLICATIONS

Lindberg, Per, International Search Report and Written Opinion received from the EPO dated Jul. 14, 2017 for appln. No. PCT/US2016/069030, 15 pgs.

Peregrine Semiconductor Corporation, Demand and Amendment filed in the EPO dated Dec. 11, 2017 for appln. No. PCT/US2016/069030, 16 pgs.

Lindberg, Per, Written Opinion received from the EPO dated Jan. 22, 2018 for appln. No. PCT/US2016/069030, 6 pgs.

Meister, Pia, International Preliminary Report on Patentability received from the EPO dated Apr. 30, 2018 for appln. No. PCT/US2016/069030, 16 pgs.

* cited by examiner

+ = B3
o = B3 + B1
x = B3 + B1 + B7

1.810 GHz to 1.880 GHz in .01 GHz steps

Reconfigurable Tunable Matching Network

Reconfigurable Tunable Matching Network

Phase Match Network

1300

1400

ADAPTIVE TUNING NETWORK FOR COMBINABLE FILTERS

BACKGROUND

(1) Technical Field

This invention relates to electronic circuits, and more particularly to radio frequency electronic circuits and related methods.

(2) Background

A simple radio system generally operates in one radio frequency (RF) band for transmitting RF signals and a separate RF band for receiving RF signals. An RF band typically spans a range of frequencies (e.g., 10 to 100 MHz per band), and actual signal transmission and reception may be in sub-bands of such bands, spaced apart to avoid interference. Alternatively, two widely spaced RF bands may be used for signal transmission and reception, respectively.

More advanced radio systems, such as some cellular telephone systems, may be operable over multiple RF bands for signal transmission and reception, but at any one time still use only one transmit sub-band and one receive sub-band within a single RF band, or only two widely spaced transmit and receive RF bands. Such multi-band operation allows a single radio system to be interoperable with different international frequency allocations and signal coding systems (e.g., CDMA, GSM). For some applications, international standards bodies have labeled common frequency bands with band labels, Bn, such as B1, B3, B7, etc. One listing of such bands may be found at https://en.wikipedia.org/wiki/UMTS_frequency_bands.

In recent years, a technique called "Carrier Aggregation" (CA) has been developed to increase bandwidth for RF radio systems, and in particularly cellular telephone systems. In one version of CA known as "inter-band" mode, cellular reception or transmission may occur over multiple RF bands simultaneously (e.g., RF bands B1, B3, and B7). This mode requires passing the receive or transmit RF signal through multiple band filters simultaneously, depending on the required band combination.

FIG. 1A is a block diagram of a prior art RF signal switching and filter circuit 100 that may be used in a CA radio system. In the illustrated example, an antenna 101 is coupled to a multi-path switch 102 that is further coupled to several RF band filters 104. The multi-path switch 102 can selectively couple the antenna 101 to the RF band filters 104 one at a time or in selected combinations. The multi-path switch 102 would typically be implemented using field-effect transistors (FETs), in known fashion. Some or all of the RF filters 104 would be coupled to other RF circuitry, such as a receiver, a transmitter, or a transceiver (not shown). In the illustrated example, band filters 104 for three frequency bands B1, B3, B7 are shown. In operation, the component RF band filters 104 (e.g., for RF bands B1, B3, B7) may be switched into circuit by the multi-path switch 102 individually in a non-CA mode, or in combinations in a CA mode.

For optimum performance, each of the band filters 104 and their desired combinations (e.g., B3 alone, B1+B3 concurrently, and B1+B3+B7 concurrently) must be impedance matched to the switch 102 and antenna 101, typically at a characteristic impedance of 50 ohms for modern radio circuits. FIG. 1B is a Smith chart 110 showing the range of unmatched impedance values of several example combinations of three modeled filters for the configuration shown in FIG. 1A. In the illustrated example, looking at the B3 frequencies only swept over a frequency range of 1.810 GHz to 1.880 GHz in 10 MHz steps, the plot points (for B3 alone, plus the effects of adding B1 or B1+B7 to B3) show that different amounts of impedance matching would be required to match a characteristic impedance of 50 ohms not only for each combination, but also for each frequency step. Accordingly, because of the impedance mismatch, the RF signal switching and filter circuit 100 is not a practical solution for a CA radio system.

If the number of combinations of bands Bn is small and the bands are far enough apart, the band filters 104 may be combined into a single feed point (i.e., no switch 102 is necessary) using passive combining techniques, such as "diplexing" or "triplexing" circuits, which use carefully tuned fixed matching networks to combine multiple filters together and approximately match impedances. For example, FIG. 2 is a block diagram of a prior art RF triplexer filter circuit 200. A bank of filters 104 is connected to an antenna 101 through various fixed combinations of inductors Ln and capacitors Cn that are designed to match the impedance of a respective filter 104 to the impedance of the antenna 101 for a specific band of frequencies (e.g., B1, B3, B7). All of the fixed matching circuit elements must be designed to complement each other. However, such an architecture prevents changing the band combinations selectively and is not practical for more than two or three bands.

To resolve this issue with a small number of frequency bands, it is possible to passively combine separate groups of band filters (e.g., Group1=B1+B3+B7, Group2=B34+B40, and Group3=B38) and then selectively activate one corresponding passively combined impedance matching circuit at a time using a single-pole, multi-throw (SPnT) switch (e.g., SP3T). However, this approach is still not flexible and must be custom designed for every combination of frequency bands. Furthermore, it is essentially not practical to use passive combining for a large number of frequency bands Bn because of the large number of possible combinations of such bands and of overlapping or adjacent frequency ranges.

Accordingly, there is a need for an ability to flexibly combine multiple frequency bands in an RF signal switching and filter circuit that may be used in a CA radio system, without degrading system performance. The present invention addresses this need.

SUMMARY OF THE INVENTION

The invention encompasses a flexible multi-path RF adaptive tuning network switch architecture that counteracts impedance mismatch conditions arising from various combinations of coupled RF band filters.

In a first RF switch architecture, a digitally-controlled tunable matching network is coupled to a multi-path RF switch in order to provide adaptive impedance matching for various combinations of RF band filters. Optionally, some or all RF band filters also include an associated digitally-controlled filter pre-match network to further improve impedance matching. In a preferred embodiment, the tunable matching network and any optional filter pre-match networks are integrated with a multi-path RF switch on an integrated circuit (IC).

In a second RF switch architecture, some or all RF band filters coupled to a multi-path RF switch include a digitally-controlled phase matching network to provide necessary per-band impedance matching. Optionally, a digitally-controlled tunable matching network may also be included on the common port of the multi-path RF switch to provide additional impedance matching capability. In a preferred embodiment, the phase matching networks and any optional tunable matching network are integrated with a multi-path RF switch within an IC.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The invention encompasses a flexible multi-path RF adaptive tuning network switch architecture that counteracts impedance mismatch conditions arising from various combinations of coupled RF band filters.

In a first RF switch architecture, a digitally-controlled tunable matching network is coupled to a multi-path RF switch in order to provide adaptive impedance matching for various combinations of RF band filters. Optionally, some or all RF band filters also include an associated digitally-controlled filter pre-match network to further improve impedance matching. In a preferred embodiment, the tunable matching network and any optional filter pre-match networks are integrated with a multi-path RF switch on an integrated circuit (IC).

In a second RF switch architecture, some or all RF band filters coupled to a multi-path RF switch include a digitally-controlled phase matching network to provide necessary per-band impedance matching. Optionally, a digitally-controlled tunable matching network may also be included on the common port of the multi-path RF switch to provide additional impedance matching capability. In a preferred embodiment, the phase matching networks and any optional tunable matching network are integrated with a multi-path RF switch within an IC.

Tunable Matching Network Architecture

Connecting a set of RF band filters to a digitally controlled multi-path RF switch allows any combination of switch throws (and hence signal switch paths) to be activated by direct mapping of control words to switch states. However, using a conventional design, activating multiple switch paths at the same time would result in a large impedance mismatch, high insertion loss, and worsened return loss as each activated RF band filter loads each other activated RF band filter. For example, when 3 adjacent RF band filters each having a 50 ohm impedance are activated at the same time, the overall impedance would drop to about 17 ohms, causing several dB of additional insertion loss (IL), and the filter response would be skewed. Such a mismatch could be reduced by adding some fixed amount of phase shift or pre-matching elements to every RF band filter path to alleviate impedance mismatch when combined, but this approach would require a custom design for every filter combination.

A more flexible architecture combines a tunable matching network (TMN) with a multi-path RF switch to adaptively counteract impedance mismatch conditions arising from various combinations of coupled RF band filters. This approach may be combined with a digitally-control led filter pre-match network to further improve impedance matching.

Figure 3:
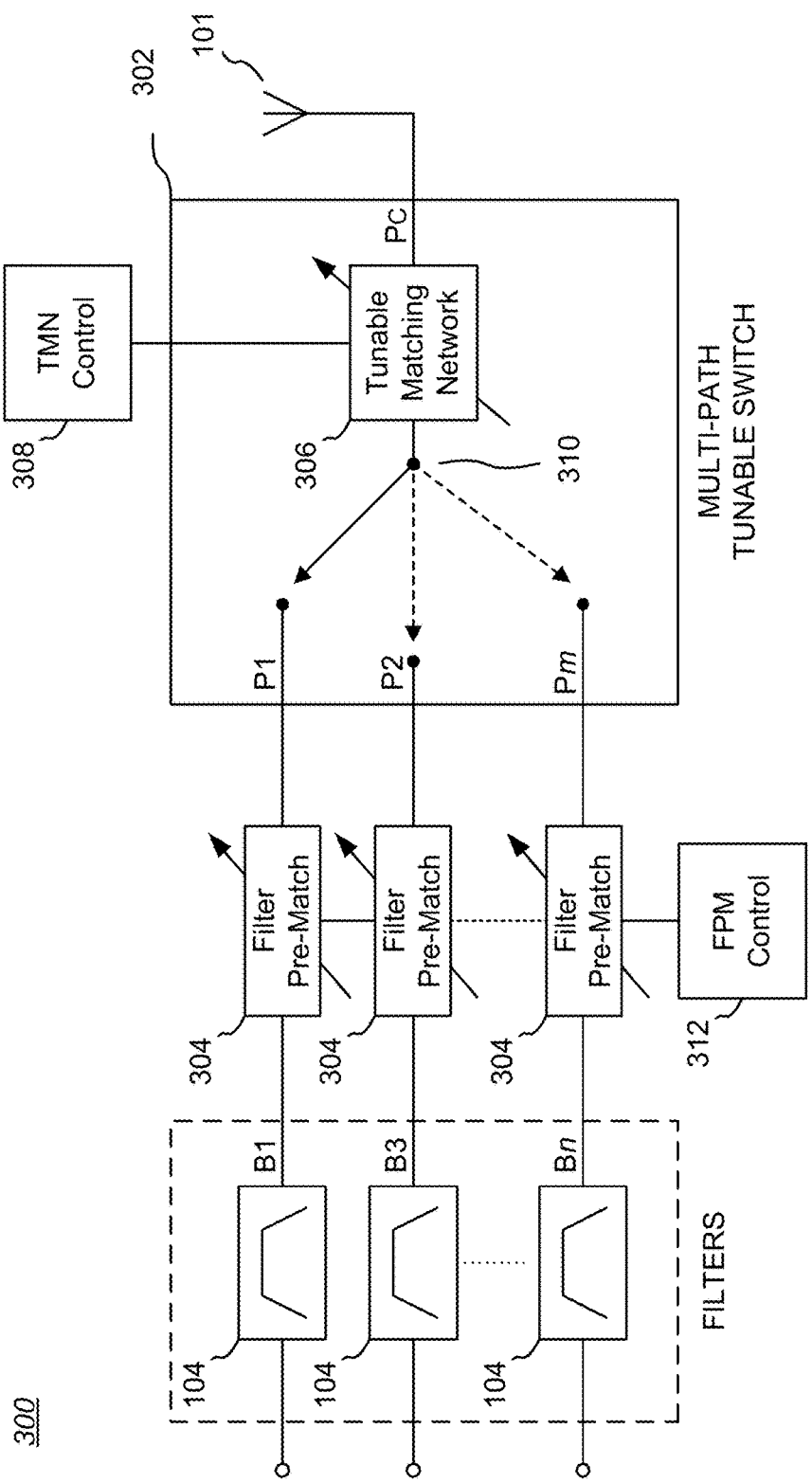
FIG. 3 is a block diagram of one embodiment of an RF signal switching and filter circuit that includes a multi-path tunable switch and, optionally, a bank of filter pre-match network, suitable for use in a CA radio system as well as in other applications.

FIG. 3 is a block diagram of one embodiment of an RF signal switching and filter circuit 300 that includes a multi-path tunable switch 302 and, optionally, a bank of filter pre-match networks 304, suitable for use in a CA radio system as well as in other applications. The illustrated multi-path tunable switch 302 includes a digitally controlled TMN 306 that may be coupled to a TMN Control circuit 308 that converts a binary control word (externally supplied or internally generated) into switch control lines. The TMN 306 is coupled to a multi-path RF switch element 310, which typically would be implemented using field-effect transistors (FETs) in known fashion. A common port $P_C$ of the multi-path tunable switch 302 may be coupled to an RF signal element, such as an antenna 101. Some number of a set of M signal ports P1-Pm may be coupled to a plurality of corresponding RF elements, particularly to a set of RF band filters 104 that can be selectively coupled to the antenna 101 one at a time or in combinations (in the illustrated embodiment, the RF band filters 104 are each shown with an associated band label, Bn, which may or may not correspond to a port designation Pm). In one embodiment, M=10, and thus up to 10 ports may be selectively placed in circuit with the common port $P_C$ alone or in parallel combinations (e.g., B1 alone, B1+B3 concurrently, and B1+B3+Bn concurrently).

The RF band filters 104 are preferably bandpass filters having a very sharp (in terms of the transition from passband to reject band) passband, which would typically would be implemented using surface acoustic wave (SAW), bulk acoustic wave (BAW), or similar filter technologies having sharp passbands. Also shown coupled between each RF band filter 104 and a corresponding port of the multi-path tunable switch 302 are digitally-controlled filter pre-match networks 304, discussed in greater detail below.

In operation, the component RF band filters 104 (e.g., for frequency bands B1, B3, . . . Bn) may be switched into circuit by the multi-path tunable switch 302 individually in a non-CA mode, or in combinations in a CA mode. For each RF band filter 104 combination, the TMN Control circuit 308 would set the TMN 306 to a calibrated state to provide proper impedance matching for the selected combination. TABLE 1 below shows an example of a 3-bit control word that defines 8 states that are mapped, by way of example, to specific active bands that correspond to some emerging industry operational modes.

TABLE 1

| State | Binary State | Active Bands | CA Mode |
|---|---|---|---|
| 0 | 0 0 0 | none | none |
| 1 | 0 0 1 | B3 | Non-CA |
| 2 | 0 1 0 | B1 | Non-CA |
| 3 | 0 1 1 | B3 and B1 | 2 band CA case 1 |
| 4 | 1 0 0 | B7 | Non-CA |
| 5 | 1 0 1 | B7 and B3 | 2 band CA case 3 |
| 6 | 1 1 0 | B7 and B1 | 2 band CA case 2 |
| 7 | 1 1 1 | B7, B3, and B1 | 3 band CA |

While the TMN Control circuit 308 is shown as being external to the multi-path tunable switch 302, it may be fabricated in conjunction with the multi-path tunable switch 302 on the same IC. The TMN Control circuit 308 may be configured to receive control words directly from an external source to set a TMN 306 to a selected impedance tuning state (e.g., based on a band combination selected by a user or external circuitry) by means of a digital interface, or control words may be indirectly supplied from a look-up table (i.e., implemented as fuses, PROM, EEPROM, etc.) containing tuning states for various RF band combinations or from various control signals processed through combinatorial circuitry. Thus, program control of the TMN Control circuit 308 can be based on a user selection or external control signal, or be automatically set in response to detected system states or parameters [see blue highlighting above] (e.g., switch state, lookup values, detected signal frequency, signal strength, power consumption, IC device temperature, etc.).

For non-CA operation, the TMN 306 may be programmed to an impedance value that essentially makes the TMN 306 nearly invisible as a load. Alternatively, the TMN 306 may include a bypass switch, as described in further detail below, to effectively remove the TMN 306 from the signal path.

Tunable Matching Networks

While the illustrated RF signal switching and filter circuit 300 shows the TMN 306 in a preferred position on the common port $P_C$ of the multi-path tunable switch 302, TMN units may instead be or also be coupled to one or more corresponding signal ports Pm; such "signal port-side" TMN units, while consuming more IC die area, may provide even more precise control of impedance matching. In any case, a TMN 306 may be placed in shunt or series connection with the signal path, and have a combination of shunt and/or series elements.

Each TMN 306 is designed to meet the impedance tuning ratio required to be able to impedance match a selected combination of RF band filters 104 with respect to the load on the common port $P_C$ while minimizing additional insertion loss. Each TMN 306 should have both a broad enough tuning range and a fine enough tuning step size to be able to handle the various desired band filter combinations efficiently.

Figure 4:
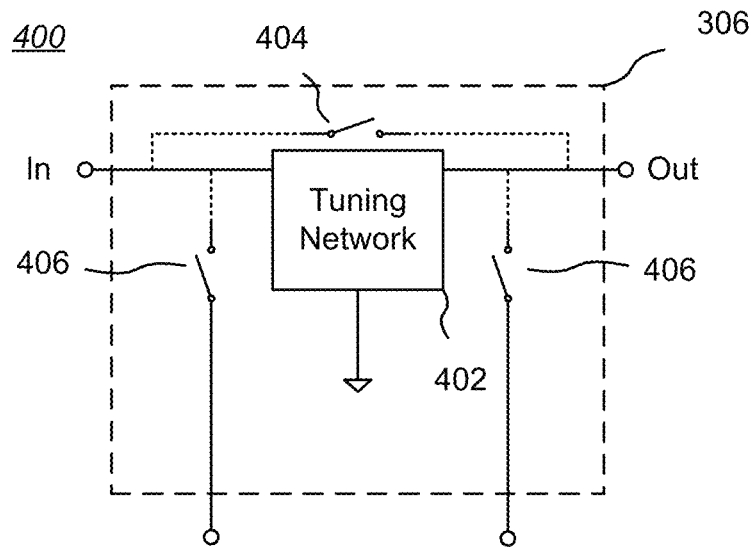
FIG. 4 is a block diagram of a generic architecture for a tunable matching network.

FIG. 4 is a block diagram 400 of a generic architecture for a tunable matching network 306. In the illustrated example, a tuning network 402 is coupled along a signal path defined by IN and OUT ports (in this case, the circuit is symmetrical and hence the port labels are arbitrary and reversible). An optional bypass switch 404 allows the tuning network 402 to be switched out of circuit when no impedance matching is desired, such as may occur in a non-CA mode. Optional switchable connections 406 allow connection to other tuning elements (e.g., external inductors or tuning networks) or load elements (e.g., an antenna).

The tuning network 402 is shown as a generic three-port device, and may be series connected between the IN and OUT ports, or configured internally to be shunt connected between the signal path and circuit ground, or configured internally as a combination of series and shunt connections—for example, selectable between a series connection or a shunt connection, or having a more complex dynamically reconfigurable topology (see further discussion below).

In greater detail, a TMN 306 may consist of one or more digitally tunable or switchable capacitors (DTCs), and/or digitally tunable or switchable inductors (DTLs), and/or digitally tunable or selectable transmission line elements (TLEs), such as microstrip or co-planar waveguides or lumped transmission line circuits. Several TMNs 306 may be used for more complicated cases. Examples of DTCs are shown in U.S. Pat. No. 9,024,700, issued on May 5, 2015, entitled "Method and Apparatus for use in Digitally Tuning a Capacitor in an Integrated Circuit Device", and examples of DTLs are shown in U.S. patent application Ser. No. 13/595,893, filed on Aug. 27, 2012, entitled "Method and Apparatus for Use in Tuning Reactance in an Integrated Circuit Device", both of which are assigned to the assignee of the present invention and both of which are hereby incorporated by reference.

Figure 5:
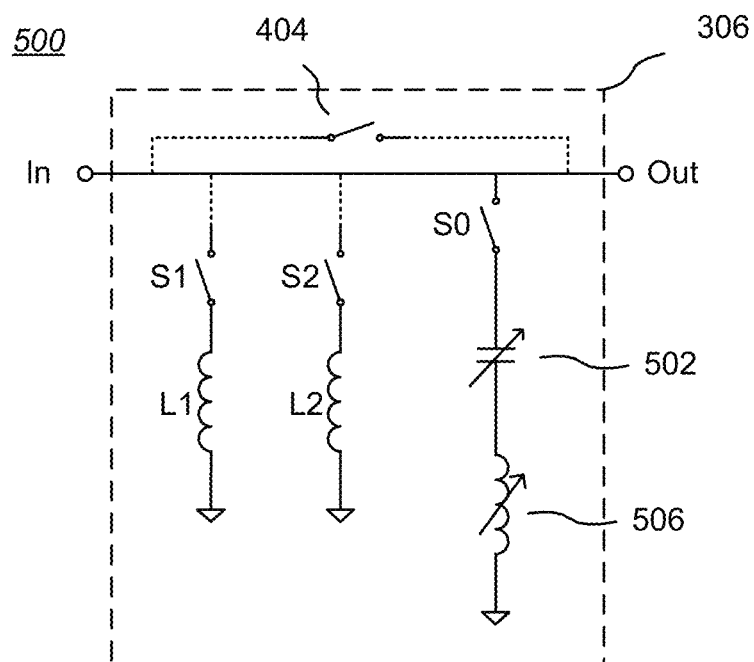
FIG. 5 is a schematic diagram of a first embodiment of a tunable matching network.

A number of useful TMN 306 designs may be used in conjunction with various embodiments of the invention. As one example, FIG. 5 is a schematic diagram 500 of a first embodiment of a tunable matching network 306. The principal adjustable impedance tuning elements are a digitally adjustable capacitor element 502 (e.g., a DTC) and a digitally adjustable inductor element 504 (e.g., a DTL) coupled in series together, and shunt connected between the IN-OUT signal path and circuit ground. In one alternative embodiment, the adjustable inductor element 504 may be replaced by a fixed inductor, and thus only the capacitor element 502 provides adjustability. In another alternative embodiment, the adjustable capacitor element 502 may be replaced by a fixed capacitor, and thus only the inductor element 504 provides adjustability. In either case, the digitally adjustable capacitor and/or inductor elements 502, 504 may be internal or external to an IC. However, in a preferred embodiment, most or all of the components of the TMN 306 are integrated on the same IC as the multi-path tunable switch 302.

Also shown in FIG. 5 are a switch S0 (e.g., a FET) that can disconnect the principal active tuning elements from the IN-OUT signal path, and two optional inductors L1, L2 that may be selectively connected by corresponding switches S1, S2 to the IN-OUT signal path to augment the impedance matching range of the tunable matching network 306. As should be clear, more or fewer than two optional inductors Ln may be included. In the illustrated embodiment, an optional bypass switch 404 is shown, but the optional switchable connections 406 of FIG. 4 are omitted.

Figure 6:
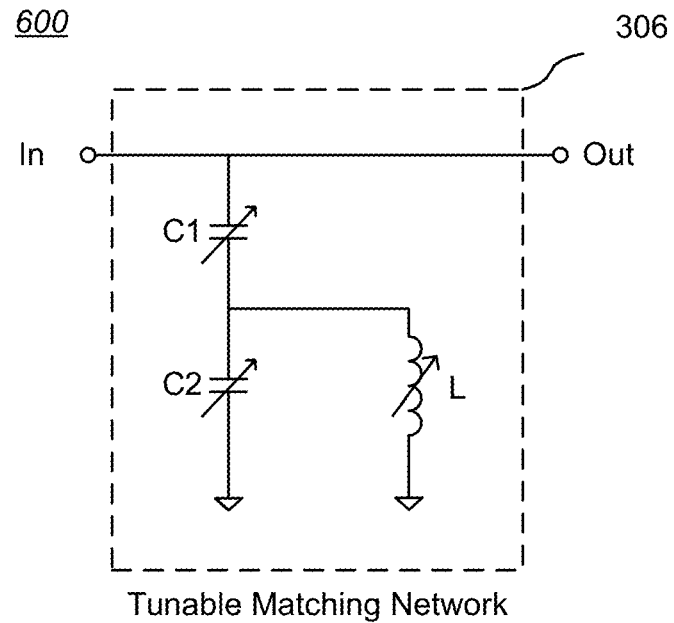
FIG. 6 is a schematic diagram of a second embodiment of a tunable matching network.

FIG. 6 is a schematic diagram 600 of a second embodiment of a tunable matching network 306. The illustrated TMN 306 includes two digitally adjustable capacitor elements C1, C2 coupled in series between the IN-OUT signal path and circuit ground, and a digitally adjustable inductor element L coupled between circuit ground and a node between the two adjustable capacitor elements C1, C2. As in FIG. 5, one or more of the adjustable capacitor and/or inductor elements may be replaced by a fixed element, so long as at least one adjustable impedance tuning element remains. For example, the inductor element L may be fixed and all tuning accomplished using one or both of the adjustable capacitor elements C1, C2. The example circuit illustrated in FIG. 6 is particularly useful because it enables coverage of more points on a Smith chart (not just a curve), thus providing a greater range of impedance matching adjustment than some other embodiments.

Figure 7:
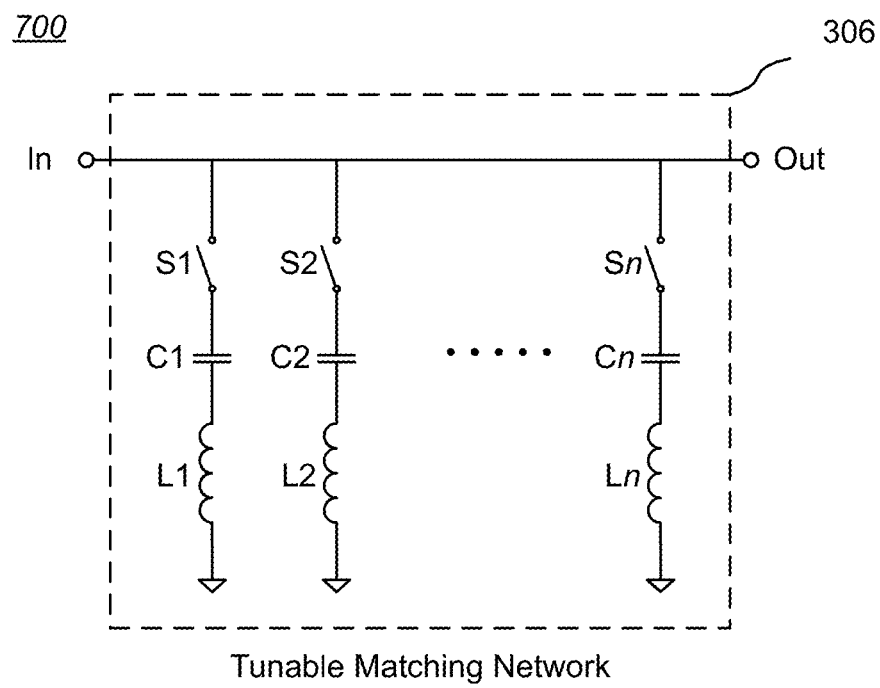
FIG. 7 is a schematic diagram of a third embodiment of a tunable matching network.

FIG. 7 is a schematic diagram 700 of a third embodiment of a tunable matching network 306. In the illustrated embodiment, a set of two or more LC circuits each comprising a fixed capacitor Cn and a fixed inductor Ln may be selectively connected by corresponding switches Sn to the IN-OUT signal path to set a matching impedance value for of the tunable matching network 306. Thus, adjustability is provided by selectively coupling one or more fixed-element LC circuits onto the IN-OUT signal path under the control of a TMN Control circuit 308 (as in FIG. 3) rather than utilizing digitally adjustable impedance tuning elements such as a DTC or DTL. In an alternative embodiment, the LC circuits in FIG. 7 may be replaced by a set of transmission line (TL) elements of varying impedance values that can be selectively coupled to the IN-OUT signal path under the control of the TMN Control circuit 308.

Filter Pre-Match Networks

As noted above with respect to FIG. 3, optionally, some or all RF band filters 104 also include an associated digitally-controlled filter pre-match (FPM) network 304 to further improve impedance matching for the corresponding RF signal path. The FPM networks 304 are preferably configured to be selectively connected to the IN-OUT signal path of an associated RF band filter 104 under the control of an FPM Control circuit 312, as shown in FIG. 3. The FPM Control circuit 312 converts a binary control word (externally supplied or internally generated) into switch control lines.

Figure 8:
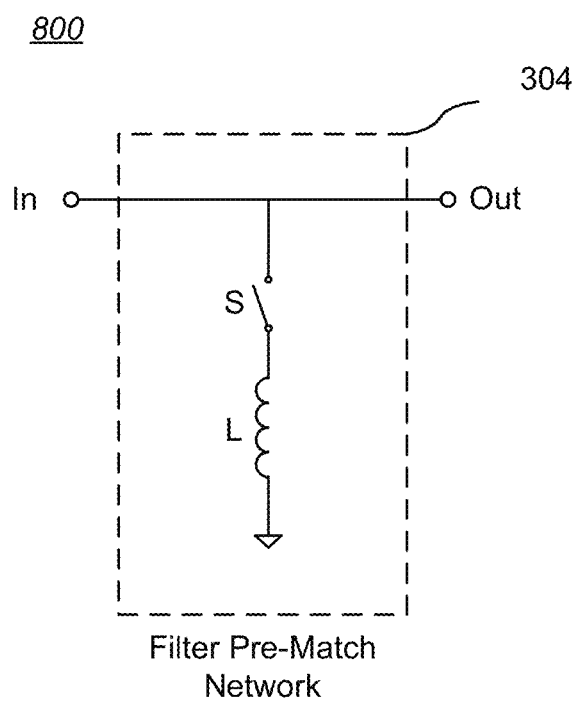
FIG. 8 is a schematic diagram of one embodiment of a digitally-controlled FPM network.

FIG. 8 is a schematic diagram of one embodiment 800 of a digitally-controlled FPM network 304. In the illustrated embodiment, an inductor L having an inductance value suitable to aid impedance matching of an associated RF band filter 104 may be selectively connected to the IN-OUT signal path of the associated RF band filter 104 by a switch S controlled by the FPM Control circuit 312. The switch S enables disconnection of the inductor L when operating in some modes, such as a non-CA mode.

In alternative embodiments, an FPM network 304 may include a digitally adjustable impedance tuning element (e.g., a DTC or DTL) in place of the simple inductor L. In appropriate applications, an FPM network 304 may be essentially any one of the same circuits described above for the TMN 306, or equivalent circuits.

The FPM networks 304 may be integrated within a multi-path tunable switch 302, or may be separate circuit elements interposed between a multi-path tunable switch 302 and corresponding RF band filters 104, or may be integrated with the corresponding RF band filters 104.

Dynamically Reconfigurable Tunable Matching Network Topology

As some of the example embodiments in FIGS. 4-7 illustrate, multiple switchable impedance tuning elements in different configurations provide a flexible solution to achieve reasonably wide coverage of a Smith chart with minimal matching loss while providing a low-loss bypass mode that can be activated when tuning is not required. However, in some applications, it is difficult to achieve a sufficiently wide RF bandwidth without other performance trade-offs when using a fixed-topology tunable matching network (e.g., variable DTCs and/or DTLs, with optional fixed capacitor and inductor elements, but in a fixed topology). Accordingly, a dynamically reconfigurable tunable network topology enables real-time reconfiguration of a tunable matching network (TMN) topology for better optimization of such parameters. A TMN reconfigurable topology uses multiple switchable elements (e.g., a fixed and/or a tunable element in series with a switch) and tunable elements (e.g., one or more variable DTCs or DTLs, generally with an integrated switch-selectable bypass path) to achieve multiple configurations.

Figure 9:
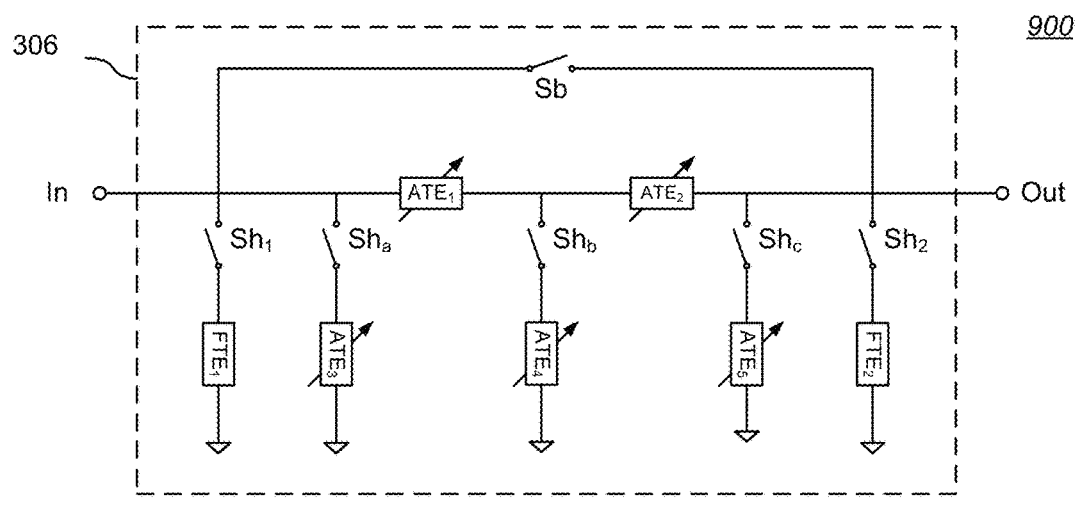
FIG. 9 is a block diagram showing a first embodiment of a dynamically reconfigurable tunable matching network topology.

FIG. 9 is a block diagram showing a first embodiment 900 of a dynamically reconfigurable tunable matching network topology 306. The illustrated example can be programmatically or selectably configured in a pi-type, T-type, or L-pad type topology in which one or more adjustable tuning elements $ATE_1$, $ATE_2$ (e.g., DTCs and/or DTLs) are connectable in series with the IN-OUT signal path of the TMN 306, while three or more adjustable tuning elements $ATE_3$, $ATE_4$, $ATE_5$ are connected as shown in a shunt configuration to circuit ground through corresponding shunt switches $Sh_a$, $Sh_b$, $Sh_c$. Some or all of the adjustable tuning elements may include an integrated switch-selectable bypass switch (not shown) that allows the element to be essentially configured as a short circuit connection. In addition, many other topologies, such as a Bridged-T type, may be configured using the same components or by adding other adjustable tuning elements or other components.

A T-type topology can be configured by coupling $ATE_1$ and $ATE_2$ in series with the IN-OUT signal path and $ATE_4$ in shunt to circuit ground (i.e., switch $Sh_b$ CLOSED), and decoupling $ATE_3$ and $ATE_5$ (i.e., switches $Sh_a$ and $Sh_c$ OPEN). A pi-type topology can be configured in several ways: (1) coupling $ATE_1$ in series with the IN-OUT signal path and $ATE_3$ and $ATE_4$ in shunt to circuit ground, while internally bypassing $ATE_2$ and decoupling $ATE_5$; (2) coupling $ATE_2$ in series with the IN-OUT signal path and ATE; and $ATE_5$ in shunt to circuit ground, while bypassing $ATE_1$ and decoupling $ATE_3$; and (3) coupling $ATE_1$ and $ATE_2$ in series with the IN-OUT signal path and $ATE_3$ and $ATE_5$ in shunt to circuit ground, while decoupling $ATE_4$. An L-pad type topology can be configured in several ways from any of the pi-type configurations by decoupling one of the two shunt ATEs.

FIG. 9 also shows a bypass switch Sb that allows the entire reconfigurable tunable matching network 306 to be bypassed, and further illustrates that one or more optional fixed tuning elements $FTE_1$, $FTE_2$ (e.g., an internal or external inductor, capacitor, or transmission line element)

can be coupled from circuit ground to the IN-OUT signal path of the TMN 306 through associated shunt switches $Sh_1$, $Sh_2$.

It should be apparent that some of the elements shown in FIG. 9 can be omitted for particular applications. For example, if only L-pad type and pi-type topologies are needed, the elements required for a T-type topology can be omitted.

Figure 10:
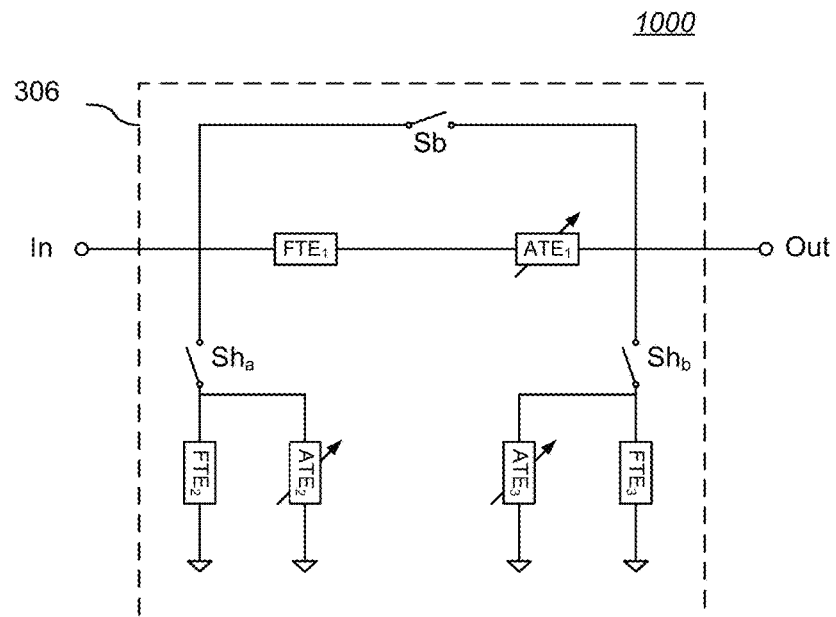
FIG. 10 is a block diagram showing a second embodiment of a dynamically reconfigurable tunable matching network topology.

FIG. 10 is a block diagram showing a second embodiment 1000 of a dynamically reconfigurable tunable matching network topology 306. In the illustrated example, an adjustable tuning element $ATE_1$ and a fixed tuning element $FTE_1$ are connectable in series with the IN-OUT signal path of the TMN 306. Two subcircuits each comprising an adjustable tuning element $ATE_2$, $ATE_3$ in parallel with a corresponding fixed tuning element $FTE_1$, $FTE_2$ to circuit ground are connectable by corresponding shunt switches $Sh_a$, $Sh_b$ to the IN-OUT signal path. The illustrated embodiment can be configured as a pi-type topology by setting both shunt switches $Sh_a$, $Sh_b$ to CLOSED, and as an L-pad type topology by setting one of the two shunt switches $Sh_a$, $Sh_b$ to CLOSED and the other shunt switch of the pair to OPEN. A bypass switch Sb allows the entire reconfigurable tunable matching network 306 to be bypassed.

The topology and/or the tuning element values of the reconfigurable tunable matching networks 306 of FIG. 9 and FIG. 10 may be programmatically set in real-time under the control of the TMN Control circuit 308 of FIG. 3, or set to a particularly configuration at the time of manufacture (e.g., by "blowing" fusible links or by applying an appropriately configured metallization mask when fabricating an IC). In addition, numerous other tunable matching network embodiments can be used in conjunction with the disclosed RF signal switching and filter circuits so long as such networks provide for a suitable range of adjustability.

Phase Matching Network Architecture

As noted above, in a second RF switch architecture, some or all RF band filters coupled to a multi-path RF switch include a digitally-controlled phase matching network to provide necessary per-band impedance matching.

Figure 11:
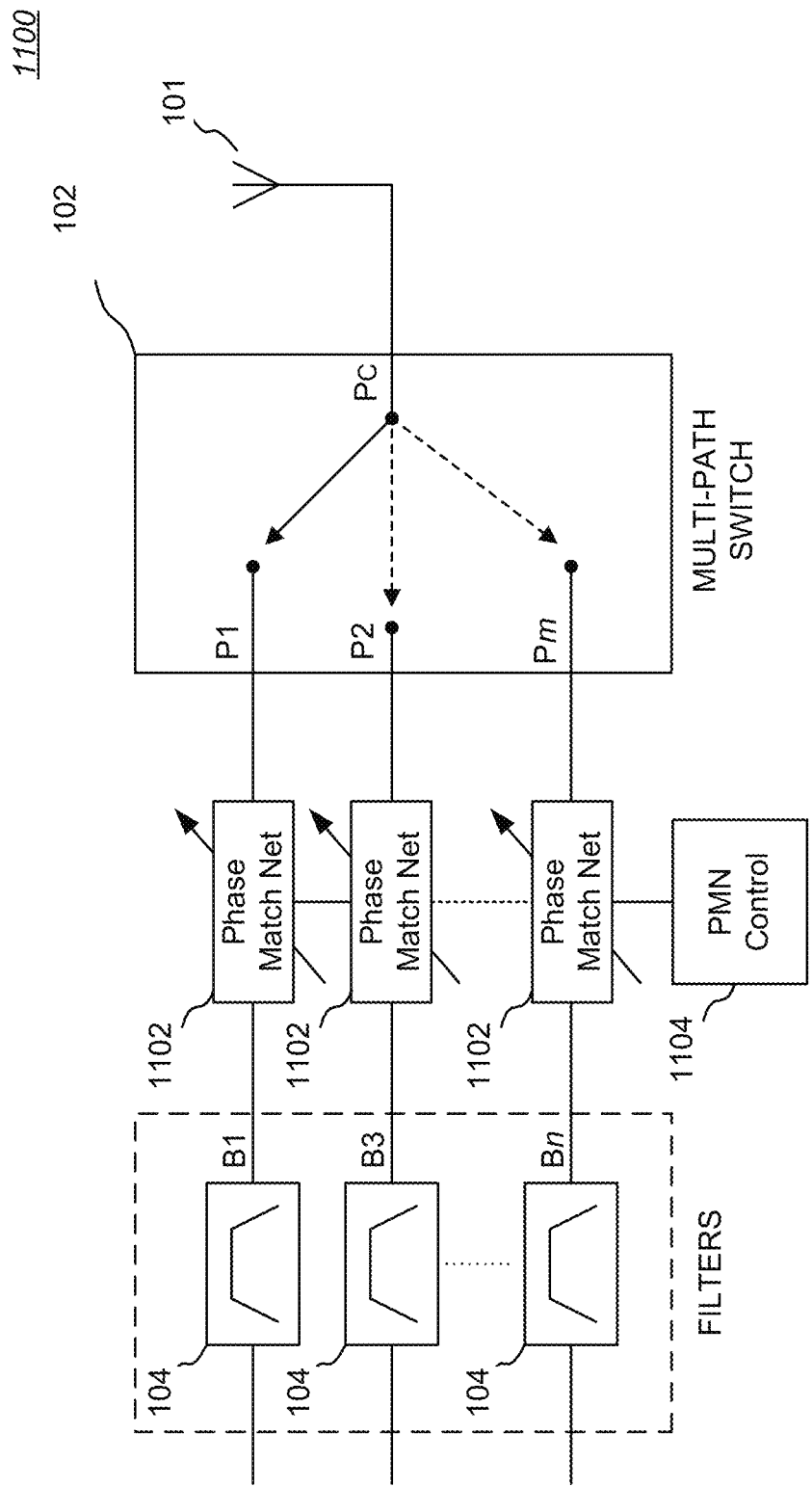
FIG. 11 is a block diagram of one embodiment of an RF signal switching and filter circuit that includes a multi-path switch coupled to a set of two or more RF band filters through a bank of corresponding phase matching networks.

FIG. 11 is a block diagram of one embodiment of an RF signal switching and filter circuit 1100 that includes a multi-path switch 102 coupled to a set of two or more RF band filters 104 through a bank of corresponding phase matching networks 1102. The phase matching (PM) networks 1102 are coupled to a PMN Control circuit 1104 that converts a binary control word (externally supplied or internally generated) into switch control lines. A common port $P_C$ of the multi-path tunable switch 102 may be coupled to an RF signal element, such as an antenna 101. As in the embodiment shown in FIG. 3, the RF band filters 104 are preferably bandpass filters having a very sharp passband, and typically would be implemented using surface acoustic wave (SAW), bulk acoustic wave (BAW), or similar filter technologies having sharp passbands.

Figure 12:
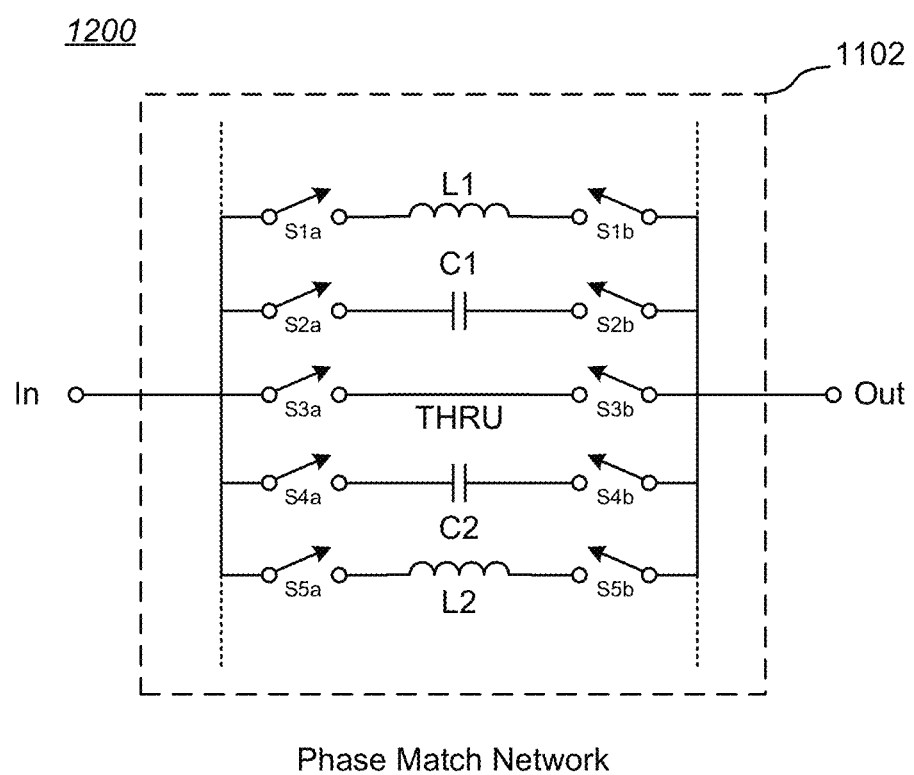
FIG. 12 is a schematic diagram of one embodiment of a phase matching network suitable for use in the circuit shown in FIG. 11.

Embodiments of the invention may include PM networks that include phase shifter circuits having two or more signal paths, such as multi-state phase shifters of the type taught in U.S. patent application Ser. No. 15/017,433, entitled "Low Loss Multi-State Phase Shifter", filed Feb. 5, 2016, and assigned to the assignee of the present invention, which is hereby incorporated by reference. For example, FIG. 12 is a schematic diagram of one embodiment 1200 of a multi-state phase matching (PM) network 1102 suitable for use in the circuit shown in FIG. 11. In the illustrated example, the PM network 1102 has IN and OUT ports connected by a plurality of n parallel circuit paths each comprising a pair of switches Sna and Snb and an associated phase shift element. Simple phase shift elements may comprise an inductor Ln, a capacitor Cn, a transmission line (not shown) or a THRU conductor (e.g., a simple wire or IC trace or similar conductor) series connected between the switch pairs Sna-Snb. More complex phase shift elements may also be used, such as a lumped transmission line comprising one or more CLC units (i.e., shunt C-series L-shunt C circuits). The phase shift elements may be physically located on the same integrated circuit (IC) die as the switch pairs Sna-Snb, or an IC may be configured with conductive pads to enable connection of external phase shift elements to the switch pairs Sna-Snb. The order of the phase shift elements is not critical, but a designer may wish to take care to minimize component interactions.

The switch pairs Sna-Snb in each of the parallel circuit paths provide input/output symmetry and are concurrently switched within a parallel circuit path to allow the associated phase shift element to be placed in-circuit between the IN and OUT ports under the control of an applied signal from the PMN Control circuit 1104. The switches Sn are typically implemented as FETs, particularly as MOSFETs. Each of the switches Sn is in a single-pole, single-throw (SPST) configuration, and thus can be implemented with a single FET device (although in order to withstand applied signal voltages in excess of the capabilities of a single FET, stacks of FET switches may be controlled by a common control line signal so as to switch ON or OFF concurrently, and thus behave like a single high-voltage SPST switch). Further, the switch pairs Sna-Snb may be independently controlled, so that two or more parallel circuit paths may be switched into circuit between the IN and OUT ports at the same time.

The illustrated PM network 1102 shows five parallel circuit paths, as set forth in TABLE 2. While five parallel circuit paths are shown, other embodiments may have more than five parallel circuit paths (as suggested by the dotted lines in FIG. 12). However, the PM network 1102 may have as few as three parallel circuit paths (e.g., circuit paths 1, 2 and 3 in TABLE 3) or even as few as two parallel circuit paths (e.g., if the THRU path is omitted in some embodiments, or if only a THRU path and one phase shift path is used).

TABLE 2

| Circuit Path | Parallel Circuit Path Components |
| --- | --- |
| 1 | S1a-L1-S1b |
| 2 | S2a-C1-S2b |
| 3 | S3a-THRU-S3b |
| 4 | S4a-C2-S4b |
| 5 | S5a-L2-S5b |

In operation, the component RF band filters 104 (e.g., for frequency bands B1, B3, . . . Bn) may be switched into circuit by the multi-path tunable switch 102 individually in a non-CA mode, or in combinations in a CA mode. The PMN Control circuit 1104 will select a particular phase shift setting for each PM network 1102 to impedance match the associated RF band filter 104 with respect to the applied load from the antenna 101 and any other RF band filter 104 switched into circuit.

The phase matching networks 1102 may be configured with other adjustable phase shifting circuits, and optionally may be configured or programmed to provide a fixed phase shift for bands Bn that are only switched into circuit singly (e.g., if band B1 is only ever used by itself and adjustable phase shifting is not needed for other reasons, such as reducing intermodulation distortion). In particular, at least one phase matching network 1102 may be a digitally-controlled tunable matching network (such as the TMN 306 of FIG. 3), including a reconfigurable TMN. Optionally, a digitally-controlled TMN 306 and TMN Control circuit 308 of the type shown in FIG. 3 may also be included on the common port $P_c$ of the multi-path RF switch to provide additional impedance matching capability.

Comparative Simulation Data

Figure 1A:
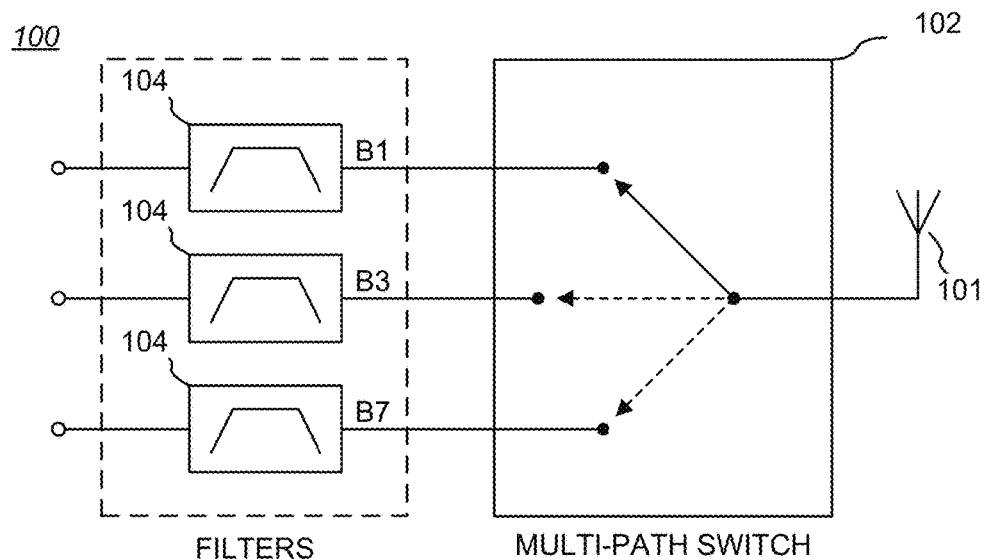
FIG. 1A is a block diagram of a prior art RF signal switching and filter circuit that may be used in a CA radio system.
Figure 1B:
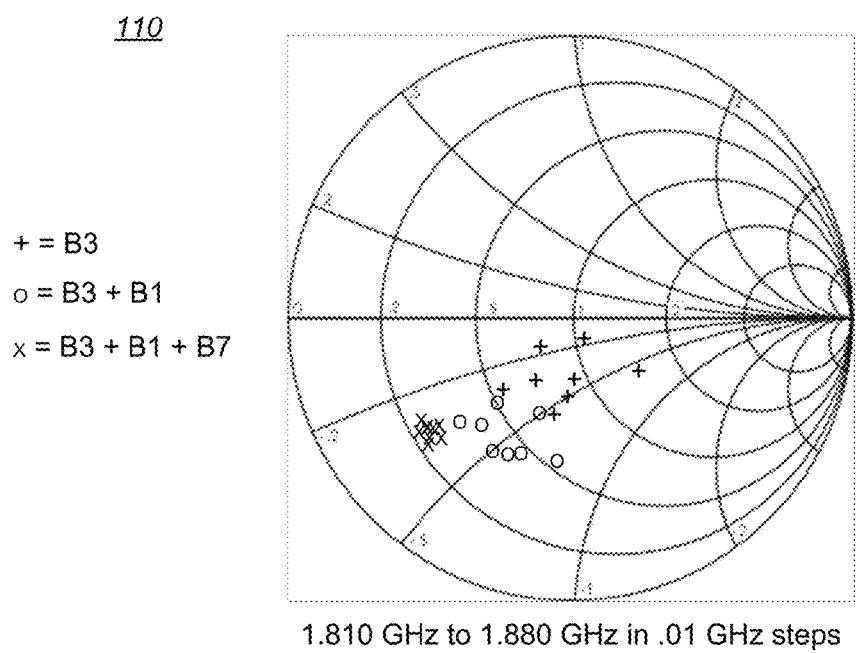
FIG. 1B is a Smith chart showing the range of unmatched impedance values of several example combinations of three modeled filters for the configuration shown in FIG. 1A.
Figure 2:
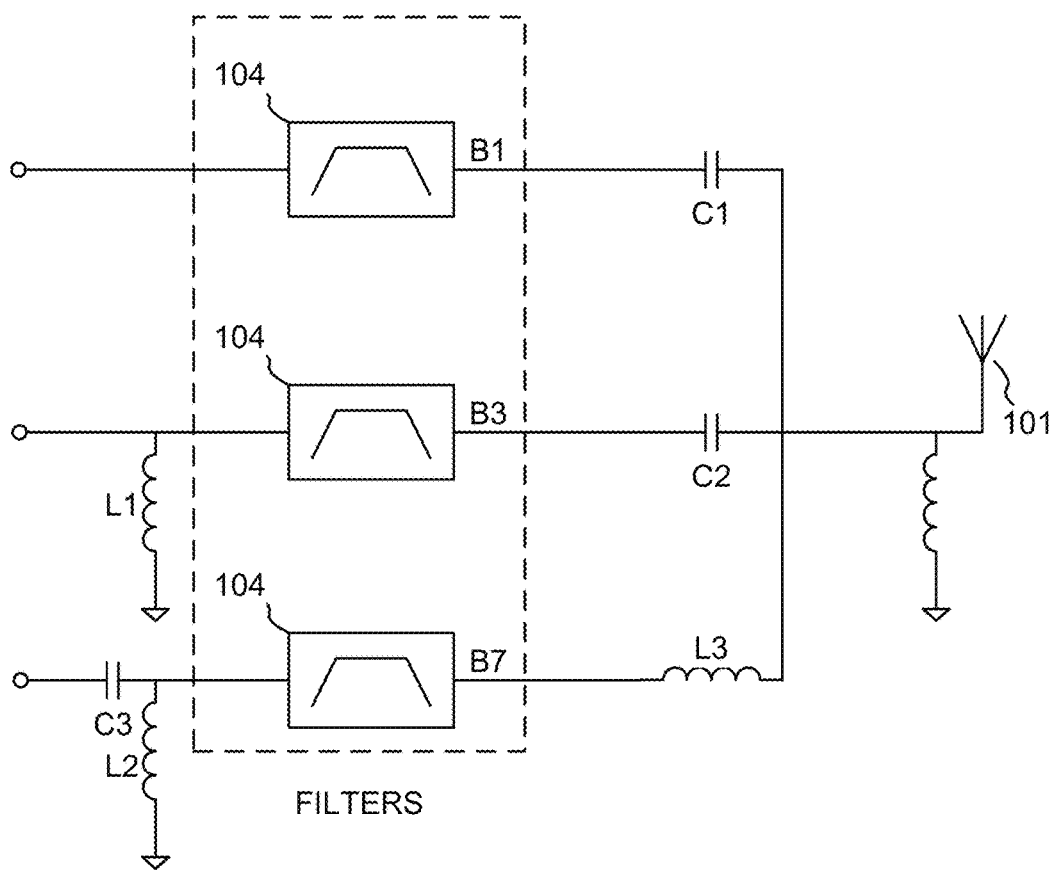
FIG. 2 is a block diagram of a prior art RF triplexer filter circuit.
Figure 13:
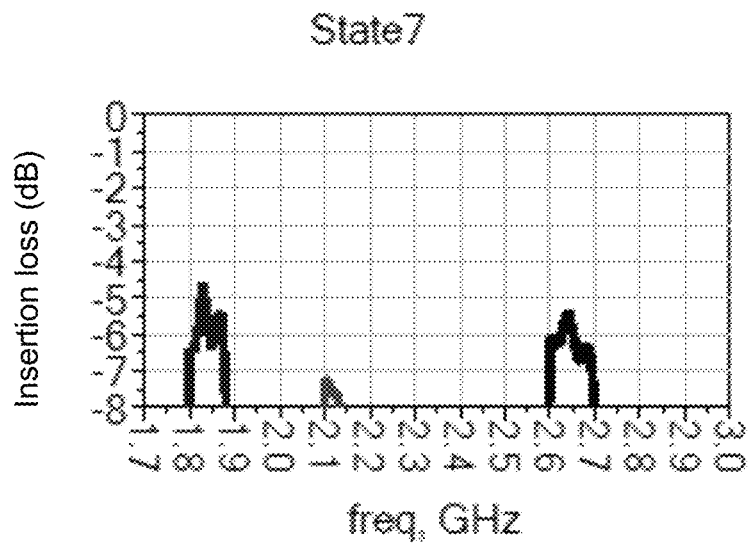
FIG. 13 is a graph of the insertion loss versus frequency of one combination of CA band filters (B1+B3+B7) for a simulation of the prior circuit shown in FIG. 1A for three frequency bands.
Figure 14:
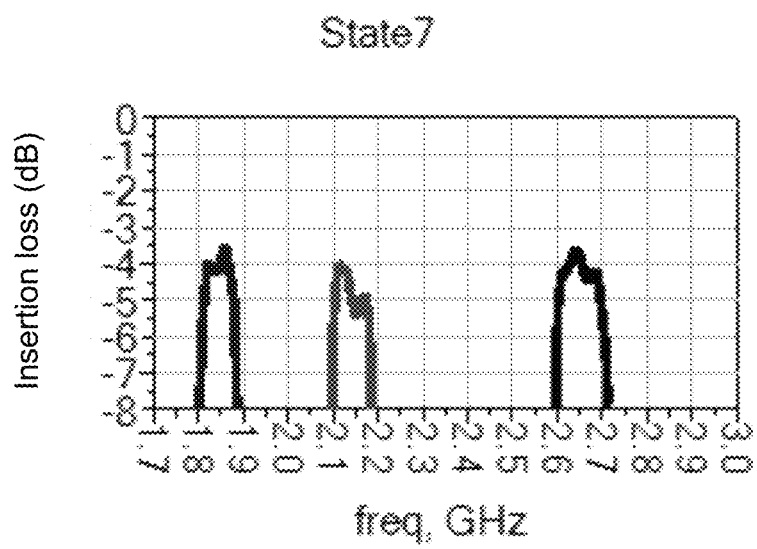
FIG. 14 is a graph of the insertion loss versus frequency for a simulation of the novel circuit shown in FIG. 3 for the same configuration of CA band filters and frequency bands shown in FIG. 13.

FIG. 13 is a graph 1300 of the insertion loss versus frequency of one combination of CA band filters (B1+B3+B7) for a simulation of the prior art circuit shown in FIG. 1A for three frequency bands. FIG. 14 is a graph 1400 of the insertion loss versus frequency for a simulation of the novel circuit shown in FIG. 3 for the same configuration of CA band filters and frequency bands shown in FIG. 13. As the two graphs 1300, 1400 demonstrate, the novel circuit of FIG. 3 shows an improvement in IL of about 1.5 dB at the low band (1.81 GHz to 1.88 GHz), about 3 dB at the mid-band (2.11 GHz to 2.18 GHz), and about 2 dB at the high band (2.61 GHz to 2.69 GHz). A similar comparison (not shown) of the prior art circuit simulation and the simulation of the novel circuit of FIG. 3 for a different combination of CA band filters (B1+B3) showed improvement in IL of more than 1.5 dB at the mid-band. In addition, the simulation of the novel circuit of FIG. 3 exhibited an IL of less than 2 dB (absolute, not comparative) for all non-CA modes.

In terms of RF performance, such improvements are significant, and are enabled by the improved impedance matching provided by the flexible multi-path RF adaptive tuning network switch architecture of the present invention.

Methods

Another aspect of the invention includes a method for adaptively tuning a multi-path radio-frequency (RF) switch, including:
- providing a multi-path tunable switch having (1) a plurality of signal ports each configured to be coupled to a corresponding RF band filter and (2) a common port;
- configuring the multi-path tunable switch to concurrently connect at least two selected signal ports to the common port in at least one mode of operation;
- coupling a digitally-controlled tunable matching network to the common port of the multi-path tunable switch; and
- selectively controlling the digitally-controlled tunable matching network to counteract impedance mismatch conditions arising from coupling more than one selected RF band filter concurrently to the common port.

Yet another aspect of the invention includes a method for adaptively tuning a multi-path radio-frequency (RF) switch, including:
- providing a multi-path tunable switch having a common port and a plurality of signal ports;
- configuring the multi-path tunable switch to concurrently connect at least two selected signal ports to the common port in at least one mode of operation;
- coupling each of a plurality of digitally-controlled phase matching networks to a corresponding signal port of the multi-path tunable switch;
- configuring each digitally-controlled phase matching network to be coupled to a corresponding RF band filter; and
- selectively controlling each digitally-controlled phase matching network to counteract impedance mismatch conditions arising from coupling more than one selected RF band filter concurrently to the common port.

Additional aspects of the methods described above include integrating the multi-path tunable switch and the digitally-controlled tunable matching network on the same integrated circuit die; coupling at least one filter pre-match network to a corresponding signal port of the multi-path tunable switch and configuring the at least one filter pre-match network to be coupled to a corresponding RF band filter; integrating the multi-path tunable switch and the at least one filter pre-match network on the same integrated circuit die; the digitally-controlled tunable matching network including at least one of a digitally tunable capacitor and/or a digitally tunable inductor; the digitally-controlled tunable matching network being reconfigurable between at least two types of topologies; coupling a signal port-side digitally-controlled tunable matching network to at least one corresponding signal port of the multi-path tunable switch; coupling a plurality of RF band filters to corresponding signal ports of the multi-path tunable switch; integrating the multi-path tunable switch and the plurality of digitally-controlled phase matching networks on the same integrated circuit die; at least one digitally-controlled phase matching network being a digitally-controlled tunable matching network; at least one digitally-controlled phase matching network including at least one of a digitally tunable capacitor and/or a digitally tunable inductor; at least one digitally-controlled phase matching network being reconfigurable between at least two types of topologies; coupling a digitally-controlled tunable matching network to the common port of the multi-path tunable switch; and coupling a plurality of RF band filters to corresponding digitally-controlled phase matching networks.

Configuration and Control

The elements that can be connected to the TMN networks 306, FPM networks 304, and PM networks 1102 are not limited to the impedance tuning elements described above (e.g., transmission line elements, fixed and adjustable capacitors, and fixed and adjustable inductors). Other elements may be connected for other applications. For example, an antenna bus can be connected to a multi-path tunable switch such that it may be used for aperture tuning.

Values for the tuning elements in (e.g., fixed inductors or DTLs, fixed capacitors or DTCs, transmission line elements, and phase shifters) are selected to optimize particular application requirements, balancing impedance coverage, bandwidth, insertion loss, transducer gain, and other limitations such as die size. The set of available impedance values may be optimized based on sub-band or RF channel information for even more optimized performance.

Each FET switch in the illustrated examples includes an associated control line (not shown) that enables setting the switch to an ON (or CLOSED) conductive state or to an OFF (or OPEN) non-conductive or blocking state, and thus behaves as a single-pole, single-throw switch. Further, stacks of FET switches may be controlled by a common control line signal so as to switch ON or OFF concurrently, and thus the stack behaves like a single switch. Each control line would be coupled to other circuitry (not shown in all cases), which may be internal or external. For example, control signals may be provided to the switch control lines through the well-known interfaces specified by the MIPI (Mobile Industry Processor Interface) Alliance, or through the well-known Serial Peripheral Interface (SPI) bus, or by direct control signal pins, or by any other convenient means. Applied control signals may be directly coupled to associated FET switches, or be processed through combinatorial logic circuitry or a mapping circuit (e.g., a lookup table) before being coupled to associated FET switches. In addition, the gate of each FET may be coupled to a driver circuit that converts a logic signal (1, 0) to a suitable drive voltage (e.g., +3V, −3V).

Examples of FET stacking are shown in U.S. Pat. No. 7,248,120, issued Jul. 24, 2007, entitled "Stacked Transistor Method and Apparatus"; U.S. Pat. No. 7,008,971, issued Aug. 8, 2006, entitled "Integrated RF Front End"; and U.S. Pat. No. 8,649,754, issued Feb. 11, 2014, entitled "Integrated RF Front End with Stacked Transistor Switch", and assigned to the assignee of the present invention, all of which are hereby incorporated by reference.

Each RF signal switching and filter circuit in accordance with the present invention may be tested and characterized by conventional testing means and packaged in a manner suitable for RF circuits, either alone or as part of a larger circuit or system.

Uses

RF signal switching and filter circuits in accordance with the present invention are useful in a wide variety of applications, including radar systems (including phased array and automotive radar systems) and radio systems. Radio system usage includes (again, without limitation) cellular radios systems (including base stations, relay stations, and handheld transceivers) that use such standards as Code Division Multiple Access ("CDMA"), Wide Band Code Division Multiple Access ("W-CDMA"), Worldwide Interoperability for Microwave Access ("WIMAX"), Global System for Mobile Communications ("GSM"), Enhanced Data Rates for GSM Evolution (EDGE), Long Term Evolution ("LTE"), as well as other radio communication standards and protocols.

Fabrication Technologies and Options

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about one GHz, and particularly above about 2 GHz). Monolithic IC implementation is particularly useful since parasitic capacitances generally can be kept low by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly SOI FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

In order to improve linearity and other performance characteristics, particularly when using an SOI-based fabrication process (including SOS), it may be especially useful to structure and fabricate FETs in accordance with the teachings of U.S. Pat. No. 7,910,993, issued Mar. 22, 2011, entitled "Method and Apparatus for use in Improving Linearity of MOSFETs Using an Accumulated Charge Sink"; and U.S. Pat. No. 8,742,502, issued Jun. 3, 2014, entitled "Method and Apparatus for use in Improving Linearity of MOSFETs Using an Accumulated Charge Sink", and assigned to the assignee of the present invention, both of which are hereby incorporated by reference A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A multi-path radio-frequency (RF) adaptive tuning network switch architecture configurable to operate in a carrier aggregation mode and in a non-carrier aggregation mode, including:
   (a) a multi-path tunable switch having (1) a plurality of signal ports each configured to be coupled to a corresponding RF band filter and (2) a common port, the multi-path tunable switch configured to concurrently connect at least two selected signal ports to the common port in at least one mode of operation;
   (b) a single digitally-controlled tunable matching network coupled to the common port of the multi-path tunable switch and selectively controlled to counteract impedance mismatch conditions arising from coupling more than one selected RF band filter concurrently to the common port; and
   (c) at least one digitally-controlled filter pre-match network for improving impedance matching and configured to be selectively coupled to or uncoupled from a corresponding signal port of the multi-path tunable switch, wherein at least one of the at least one digitally-controlled filter pre-match network is uncoupled from the corresponding signal port of the multi-path tunable switch when that corresponding signal port is operating in a non-carrier aggregation mode.

2. The multi-path radio-frequency (RF) adaptive tuning network switch architecture of claim 1, wherein the multi-path tunable switch and the digitally-controlled tunable matching network are integrated on the same integrated circuit die.

3. The multi-path radio-frequency (RF) adaptive tuning network switch architecture of claim 1, wherein the multi-path tunable switch and the at least one digitally-controlled filter pre-match network are integrated on the same integrated circuit die.

4. The multi-path radio-frequency (RF) adaptive tuning network switch architecture of claim 1, wherein the digitally-controlled tunable matching network includes at least one of a digitally tunable capacitor and/or a digitally tunable inductor.

5. The multi-path radio-frequency (RF) adaptive tuning network switch architecture of claim 1, wherein the digitally-controlled tunable matching network is reconfigurable between at least two types of topologies.

6. The multi-path radio-frequency (RF) adaptive tuning network switch architecture of claim 1, wherein at least one signal port of the multi-path tunable switch includes a corresponding signal port-side digitally-controlled tunable matching network.

7. A multi-path radio-frequency (RF) adaptive tuning network switch architecture configurable to operate in a carrier aggregation mode and in a non-carrier aggregation mode, including:
   (a) a multi-path tunable switch having a common port and a plurality of signal ports, and configured to concurrently connect at least two selected signal ports to the common port in at least one mode of operation;
   (b) a plurality of RF band filters coupled to corresponding signal ports of the multi-path tunable switch;
   (c) a single digitally-controlled tunable matching network coupled to the common port of the multi-path tunable switch and selectively controlled to counteract impedance mismatch conditions arising from at least one combination of at least two selected RF band filters concurrently connected to the common port; and
   (d) at least one digitally-controlled filter pre-match network for improving impedance matching and configured to be selectively coupled to or uncoupled from a corresponding signal port of the multi-path tunable switch, wherein at least one of the at least one digitally-controlled filter pre-match network is uncoupled from the corresponding signal port of the multi-path tunable switch when that corresponding signal port is operating in a non-carrier aggregation mode.

8. The multi-path radio-frequency (RF) adaptive tuning network switch architecture of claim 7, wherein the multi-path tunable switch and the digitally-controlled tunable matching network are integrated on the same integrated circuit die.

9. The multi-path radio-frequency (RF) adaptive tuning network switch architecture of claim 7, wherein the multi-path tunable switch and the at least one digitally-controlled filter pre-match network are integrated on the same integrated circuit die.

10. The multi-path radio-frequency (RF) adaptive tuning network switch architecture of claim 7, wherein the digitally-controlled tunable matching network includes at least one of a digitally tunable capacitor and/or a digitally tunable inductor.

11. The multi-path radio-frequency (RF) adaptive tuning network switch architecture of claim 7, wherein the digitally-controlled tunable matching network is reconfigurable between at least two types of topologies.

12. The multi-path radio-frequency (RF) adaptive tuning network switch architecture of claim 7, wherein at least one signal port of the multi-path tunable switch includes a corresponding signal port-side digitally-controlled tunable matching network.

13. A method for adaptively tuning a multi-path radio-frequency (RF) switch configurable to operate in a carrier aggregation mode and in a non-carrier aggregation mode, including:
   (a) providing a multi-path tunable switch having (1) a plurality of signal ports each configured to be coupled to a corresponding RF band filter and (2) a common port;
   (b) configuring the multi-path tunable switch to concurrently connect at least two selected signal ports to the common port in at least one mode of operation;
   (c) coupling a single digitally-controlled tunable matching network to the common port of the multi-path tunable switch;
   (d) providing at least one digitally-controlled filter pre-match network for improving impedance matching and configured to be selectively coupled to or uncoupled from a corresponding signal port of the multi-path tunable switch, wherein at least one of the at least one digitally-controlled filter pre-match network is uncoupled from the corresponding signal port of the multi-path tunable switch when that corresponding signal port is operating in a non-carrier aggregation mode; and
   (e) selectively controlling the digitally-controlled tunable matching network and the at least one digitally-controlled filter pre-match network to counteract impedance mismatch conditions arising from coupling more than one selected RF band filter concurrently to the common port.

14. The method of claim 13, further including integrating the multi-path tunable switch and the digitally-controlled tunable matching network on the same integrated circuit die.

15. The method of claim 13, further including integrating the multi-path tunable switch and the at least one digitally-controlled filter pre-match network on the same integrated circuit die.

16. The method of claim 13, wherein the digitally-controlled tunable matching network includes at least one of a digitally tunable capacitor and/or a digitally tunable inductor.

17. The method of claim 13, wherein the digitally-controlled tunable matching network is reconfigurable between at least two types of topologies.

18. The method of claim 13, further including coupling a signal port-side digitally-controlled tunable matching network to at least one corresponding signal port of the multi-path tunable switch.

19. The method of claim 13, further including coupling a plurality of RF band filters to corresponding signal ports of the multi-path tunable switch.

* * * * *